US005723535A

United States Patent [19]
Krismer et al.

[11] Patent Number: 5,723,535
[45] Date of Patent: Mar. 3, 1998

[54] PASTES FOR THE COATING OF SUBSTRATES, METHODS FOR MANUFACTURING THEM AND THEIR USE

[75] Inventors: Bruno E. Krismer; Uwe Thies; Peter Ladstätter; Rudolf Hünert, all of Goslar, Germany

[73] Assignee: H.C. Starck GmbH & Co., KG, Goslar, Germany

[21] Appl. No.: 733,468

[22] Filed: Oct. 16, 1996

Related U.S. Application Data

[63] Continuation of Ser. No. 624,207, Apr. 3, 1996, abandoned, which is a continuation of Ser. No. 297,656, Aug. 29, 1994, abandoned.

[30] Foreign Application Priority Data

Sep. 13, 1993 [DE] Germany ............... 44 31 006.0

[51] Int. Cl.$^6$ .............. C08J 3/00; C08K 3/20; C08L 75/00; B32B 15/00
[52] U.S. Cl. .......... 524/591; 101/130; 101/453; 427/447; 428/615; 524/401; 524/403; 524/404; 524/406; 524/408; 524/413; 524/495; 524/496; 106/1.13; 106/1.05; 106/640; 106/403; 252/502; 252/510; 252/511; 252/512
[58] Field of Search ............... 106/1.13, 1.05, 106/640, 403, 472, 479, 480, 481; 252/502, 510, 511, 512, 513, 514, 515, 518, 519, 520; 524/401, 591, 403, 406, 413, 404, 408, 495, 496; 428/615; 427/447; 101/130, 453; 501/82

[56] References Cited

U.S. PATENT DOCUMENTS

| | | | |
|---|---|---|---|
| 3,755,044 | 8/1973 | Sebel | 156/289 |
| 3,844,729 | 10/1974 | Sedlatschek et al. | 29/195 |
| 3,947,286 | 3/1976 | Myers et al. | 106/286 |
| 4,024,629 | 5/1977 | Lemonie et al. | 29/852 |
| 4,111,851 | 9/1978 | Shai et al. | 252/518 |
| 4,499,233 | 2/1985 | Tetenbaum et al. | 524/591 |
| 4,546,065 | 10/1985 | Amendola et al. | 430/313 |
| 5,041,242 | 8/1991 | Fowle et al. | 252/511 |
| 5,051,382 | 9/1991 | Newkirk et al. | 501/87 |
| 5,156,770 | 10/1992 | Wetzel et al. | 252/510 |
| 5,171,631 | 12/1992 | Adkin | 428/385.5 |

FOREIGN PATENT DOCUMENTS

| | | | |
|---|---|---|---|
| 3408238 | 9/1985 | Germany | C09D 1/02 |
| 4202705A1 | 5/1993 | Germany | C23C 18/30 |
| 4133487C2 | 7/1993 | Germany | G01N 33/32 |

OTHER PUBLICATIONS

Copy of European Patent Office Search Report Application EP 94 11 4169, dated Oct. 5, 1995.

Primary Examiner—Patrick Niland
Attorney, Agent, or Firm—Jerry Cohen

[57] ABSTRACT

The present invention relates to pastes for the coating of substrates, consisting of powdery materials present in liquid dispersion from the group of the metals, metal compounds and/or metal alloys and/or boron and/or carbon, methods for manufacturing them and their use.

19 Claims, No Drawings

PASTES FOR THE COATING OF SUBSTRATES, METHODS FOR MANUFACTURING THEM AND THEIR USE

This is a continuation of application Ser. No. 08/624,207, filed Apr. 3, 1996, now abandoned, which is a continuation of application Ser. No. 08/297,656, filed Aug. 29, 1994, now abandoned.

BACKGROUND OF THE INVENTION

The present invention relates to pastes for the coating of substrates. The pastes comprise powdery materials present in liquid dispersion from the group of the metals, metal compounds and/or metal alloys and/or boron and/or carbon. This invention covers such pastes, coated products, methods for manufacturing them and their use.

Pastes for the manufacture of strip conductors, resistors, capacitors or solders based on organic solvents are sufficiently well known. Also known are such pastes for the manufacture of optical coatings and for the shielding of magnetic, electromagnetic or neutron radiation.

The coating of substrates with such pastes, where dispersions of powdery materials in organic binders and/or solvents are involved, has likewise been common practice for many years. Thus pastes are known from the patents U.S. Pat. No. 4,024,629 and U.S. Pat. No. 4,546,065, in which mixtures of cyclohexanol, ethanol and toluene are disclosed as typical dispersants and solvents. These mixtures of known polar, non-polar and aromatic solvents are ecologically dubious in various respects. They are odor-intensive, flammable, hazardous to waste and, in some cases, toxic. Special industrial safety measures and arrangements to prevent emissions of a costly nature have to be taken when using these pastes.

In general it can be stated that all currently known commercially significant pastes are manufactured on the basis of the conventional organic solvents, optionally in combination with binders. If binders are used, they assume the function of film formation. Water varnishes, for example, contain pigments in combination with one or more water-dilutable binders. German patent 4133487 describes e.g. the use of metal pigments in combination with water-dilutable binders based on polyesters, polyacrylates or polyurethanes. The function of the binder or binders is the formation of a coherent film which encloses the pigment to be applied and thereby fixes and protects it. Similarly U.S. Pat. No. 5,171,631 describes the incorporation of the pigment titanium dioxide, used as a dyestuff, into a system consisting of organic binders—in this case copolymers based on vinyl acetate/butyl acrylate with the use of alumina trihydrate as a non-ionic theological additive, introduced into the solvent propylene glycol. In this case also the function of the applied layer is established only in the presence of the binder or binders. German patent 4202705-A1 describes the coating of substrates with noble metals consisting of a water-based system in which the metal component is present as a solution. In this case also (page 2, line 5 of the patent) a polymeric organic film or matrix former is required. The noble metal to be deposited is in this case precipitated out of a solution by in-situ reduction directly on the surface, wherein the preferred noble metal concentration in solution is 0.01 to 2 wt %, preferably 0.02 to 0.5 wt %. This patent therefore describes the deposition of a metal with the assistance of a binder out of the solution, and not precipitation out of a dispersion.

The object of the present invention is to provide pastes which are in no way inferior to the known pastes as regards their technical suitability, but on the other hand do not possess the described disadvantages of the pastes of prior art.

SUMMARY OF THE INVENTION

Pastes have now been found which meet this object. Pastes for the coating of substrates are involved, consisting of powdery materials present in liquid dispersion from the group of the metals, metal compounds and/or metal alloys and/or boron and/or carbon, which are characterized in that the liquid dispersions involved are ones based on water which contain water-dilutable non-ionic rheological additives and may be provided in forms free from binders and organic solvents.

The pastes according to the invention are therefore available free from organic solvents. During their use they can be processed into serviceable layers without the use of organic solvents and/or chloro-fluorocarbon materials (CFCs) and/or organochlorines.

The pastes according to the invention are dilutable with water. All additive components which are required for adjusting the rheological properties, such as e.g. the viscosity of the pastes, according to the invention, can either be removed completely during the manufacture of the coatings during a heat treatment or remain as inert residues in the heat-treated layers. If necessary they can easily be removed by means of water during the processing, e.g. during the cleaning of the processing equipment, and therefore do not require the application of organic solvents. In addition these pastes are odour-neutral and not flammable. Ecological damage, such as is complained of with the currently used pastes, cannot be anticipated with the pastes according to the invention.

The pastes according to the invention are mixtures comprising the powdery materials and water-dilutable, rheologically active additives and as mentioned above preferrably free, essentially from all binders and organic solvents. Aqueous silicic acid dispersions can for example be used according to the invention. Preferred also as non-ionic rheological additives are associative thickeners based on polyurethane, particularly preferred being those based on tolulene diisocyanates (TDI) and/or hexamethylene diisocyanates (HDI). Also preferred are diphenylmethane diisocyanates (MDI) and/or isophorone diisocyanates (IPDI). If necessary further wetting agents and/or stabilizers can be included. Typical dispersed powdery materials are metals —such as e.g. powders of the refractory metals niobium, tantalum, molybdenum, tungsten or of the transition metals such as e.g. iron, cobalt, nickel, chromium, copper etc. or of the noble metals silver, gold, platinum, palladium, alloys—e.g. noble metal alloys such as silver/palladium-, oxides—such as e.g. the oxides of the refractory metals niobium, tantalum, molybdenum, tungsten or oxides with particular electrical properties such as e.g. zirconium oxide, indium-tin oxide, tantalates, niobates, rare earth oxides etc. or oxides with magnetic properties—, nitrides —such as e.g. titanium nitride or aluminium nitride or boron nitride—, carbides and carbonitrides—such as e.g. tungsten carbide, tantalum carbide or tungsten titanium carbide, titanium carbinitride—, boron or borides, such as e.g. amorphous or crystalline elemental boron, aluminium boride, rare earth borides such as e.g. europium boride and/or gadolinium boride, etc., silicides, such as e.g. molybdenum silicides or tungsten silicides in stoichiometric and non-stoichiometric form, chalcogenides such as e.g. zinc sulfide, molybdenum sulfide and/or tungsten sulfide and/or carbon in various modifications. The above-mentioned solids can be present individually or as any mixtures. The solid content of the pastes according to the invention is preferably 5 to 95 wt %, particularly preferably 50 to 90 wt %. The range of the components present in the dispersion should preferably be so selected that the solids of the pastes do not contain any organic residual substances after a heat treatment to 550° C.

The pastes according to the invention can be manufactured by the powdery materials being dispersed in water and the rheological properties of the aqueous dispersions being adjusted by means of rheologically active additives. It may be advantageous at the same time to modify the rheological properties of the pastes additionally by means of wetting agents. Conventional polyurethane thickeners already contain suitable wetting agents in some cases.

This invention also provides for the use of the pastes according to the invention. The pastes are exceptionally suitable for the coating of inorganic substrates, such as e.g. glass, ceramic, glass ceramic, enamel and metals, and also those on an organic base, such as e.g. plastics materials. The coating of the substrates preferably takes place by means of printing techniques, particularly preferably silk screen printing, and/or squeegeeing and/or pouring and/or dipping and/or spraying and/or electrostatic deposition methods. The required structuring of the layers can preferably be undertaken by printing techniques or lithographically—also by means of UV lithography. The application of all conceivable printing techniques is possible. The pastes according to the invention are particularly suitable as metallization pastes. The invention also includes the coated products.

DETAILED DESCRIPTION OF PREFERRED EMBODIMENTS

The invention will be explained by examples below, without the latter being limiting in any way.

EXAMPLES

Example 1 (Molybdenum paste)

In order to manufacture a molybdenum paste, 70 wt % of molybdenum metal powder with a mean particle size of approx. 2 μm (FSSS) were dispersed with 5 wt % of the associative thickener Borchigel*) LW44 (HDI= hexamethylene diisocyanate, 44% emulsion in water), 8 wt % of Borchigen*) DFN (polyglycol ether) and 3 wt % of the wetting agent Borchigen*) ND (phosphoric acid ester amine salt) with water (to 100 wt %).

The paste manufactured in this way is exceptionally suitable for the manufacture of strip conductors in ceramic multi-chip modules based on aluminium oxide and in particular also allows the plated-through holes between the individual layers to be filled in a printing step. The steps of applying the pastes to such substrates are, per se, well known in the art.

Example 2 (Tungsten paste)

A dispersion of 75 wt % of tungsten metal powder with FSSS=1.4 μm and 12.5 wt % of the associative thickener Borchigel*) DP40 (TDI=toluylene diisocyanate, 44% emulsion in water) was prepared with water (to 100 wt %) as a metallization paste.

Example 3 (Silicide paste)

As per Example 1 a dispersion of 60 wt % of molybdenum disilicide with a mean particle size of 10 μm (FSSS) and 11 wt % of the PU additive Borchigen*) DFN in water (balance to 100%) was manufactured. The rheological properties of the paste were also adjusted by the addition of 5 wt % silicic acid dispersion (30% dispersion in water). The paste manufactured in this way is exceptionally suitable for the application of heat resistant layers to ceramic substrates, such as e.g. silicon nitride.

Example 4 (Oxide paste)

As per the previous examples a dispersion of 65 wt % niobium oxide with a mean particle size of 2 μm (FSSS) and 5 wt % Borchigel*) LW44 (HDI) together with 11 wt % Borchigen*) ND in water was prepared as a paste for the manufacture of a dielectric coating.

Example 5 (Alloy paste)

75 wt % of a powdered nickel/chromium/boron alloy with a mean particle size of 15 μm and 8 wt % Borchigen*) DFN together with 3 wt % Borchigen*) ND were dispersed in water. A usable metallization paste was obtained.

Example 6 (Metal paste)

81.6 wt % of silver powder with a mean particle size of 0.3–5 mm to FSSS and 7.4 wt % Borchigen*) DFN were dispersed in water. A paste was obtained which is exceptionally suitable for the application of conductive layers, such as e.g. the edge metallization of ceramic capacitors or for the application of resistor runs to glass.

Example 7 (Metal paste)

72.3% of nickel powder with a mean particle size of <3 mm to FSSS and spherical particle shape were dispersed with 8.9 wt % of Borchigen*) DFN in water. The nickel paste manufactured in this way is exceptionally suitable for the manufacture of conductive layers, such as e.g. the inner conductor tracks of ceramic capacitors.

Example 8 (Metal paste)

90.6 wt % of tantalum powder of capacitor quality was dispersed with 0.3 wt % Borchigen*) DFN and Borchigen*) ND respectively in water. The paste manufactured in this way is exceptionally suitable for the manufacture of anodes for electrolytic capacitors.

*) "Borchigel" and "Borchigen" are registered trade marks of the firm Gebr. Borchers AG, Goslar, Germany.

The pastes given in the examples were applied by means of silk screen printing to suitable substrates and dried at temperatures up to 550° C. The drying took place for oxide-containing pastes in the air. Metal-containing pastes were dried under protective gas or in a vacuum. The organic additives contained in the pastes were completely removed in all cases. Additional cleaning steps were not necessary. The temperature was then raised, so that the solid powder particles sintered until the coated substrate had attained the required properties.

We claim:

1. Metallization paste and comprising:
   (a) as a first dispersed solid component 50–90 weight percent of powders selected from the group consisting of Nb, Ta, Mo, W, Cr, Re, Au, Ag, Pt, Pd, Fe, Ni, C, B, Co, Mo and Ti,
   (b) as a second component, 0.2 to 20 weight percent, referred to solids content, of an associative thickener in the form of a water emulsion with an active ingredient selected from the group consisting of tolulene diisocyanates (TDI) diphenylmethane diisocyanates (MDI), isophorone diisocyanates (IPDI), and hexamethylene diisocyanates (HDI),
   (c) balance essentially water, and wherein
   (d) the paste is printable.

2. Paste and comprising:
   (a) as a first dispersed component 50–90 weight percent of chemical compound or alloy powders selected from the group consisting of niobium oxide, tantalum oxide, molybdenum oxide, tungsten oxide, zirconium oxide, indium-tin oxide, rare earth oxides, tantalates, niobates, titanium nitride, aluminum nitride, boron nitride, aluminum boride, rare earth borides and chalcogenides, (b) as a second component, 0.2 to 20 weight percent, referred to solids content, of an associative thickener in the form of a water emulsion with an active ingredient selected from the group consisting of tolulene diisocyanates (TDI) diphenylmethane diisocyanates (MDI), isophorone diisocyanates (IPDI), and hexamethylene diisocyanates (HDI).

(c) balance essentially water, and wherein (d) the paste is printable.

3. Silicide paste and comprising:

(a) as a first dispersed component 50–90 weight percent of silicide powders selected from the group consisting of molybdenum silicide and tungsten silicide (b) as a second component, 0.2 to 20 weight percent, referred to solids content, of an associative thickener in the form of a water emulsion with an active ingredient selected from the group consisting of tolulene diisocyanates (TDI) diphenylmethane diisocyanates (MDI), isophorone diisocyanates (IPDI), and hexamethylene diisocyanates (HDI).

(c) balance essentially water, and wherein (d) the paste is printable.

4. Paste in accordance with any of claims 1, 2 or 3 and comprising as a further component (b') a silicic acid dispersion in water, as 0.1 to 1.0 weight percent calculated as $SiO_2$ and referred to the solids content of the paste.

5. Metallization paste which is formed and processable without use of organic solvents and comprising:

(a) as a first dispersed solid component 50–90 weight percent of powders selected from the group consisting of Nb, Ta, Mo, W, Cr, Re, Au, Ag, Pt, Pd, Fe, Ni, C, B, Co, Mo and Ti.

(b) as a second component, 0.2 to 20 weight percent, referred to solids content, of a water soluble associative polyurethane (c) balance essentially water, and wherein (d) the paste is printable and also able to substantially liberate, upon heating, all thickener and organics content thereof.

6. Paste which is formed and processable without use of organic solvents and comprising:

(a) as a first dispersed component 50–90 weight percent of chemical compound or alloy powders selected from the group consisting of niobium oxide, tantalum oxide, molybdenum oxide, tungsten oxide, zirconium oxide, indium-tin oxide, rare earth oxides, tantalates, niobates, titanium nitride, aluminum nitride, boron nitride, aluminum boride, rare earth borides and chalcogenides, (b) as a second component, 0.2 to 20 weight percent, referred to solids content, of a water soluble associative polyurethane, (c) balance essentially water, and wherein (d) the paste is printable and also able to substantially liberate, upon heating, all thickener and organics content thereof.

7. Silicide paste which is formed and processable without use of organic solvents and comprising:

(a) as a first dispersed component 50–90 weight percent of silicide powders selected from the group consisting of molybdenum silicide and tungsten silicide (b) as a second component, 0.2 to 20 weight percent, referred to solids content, of a water soluble associative polyurethane, (c) balance essentially water, and wherein (d) the paste is printable and also able to substantially liberate, upon drying, all thickener and organics content thereof.

8. Pastes according to any of claims 5–7, characterized in that the paste has a solids content of 50 to 90 wt % of the powdery materials.

9. Pastes according to any of claims 5–7, characterized in that their solids do not contain any organic residual substances after a heat treatment up to 550° C.

10. Pastes according to any of claims 5–7, characterized in that the pastes are metallization pastes, wherein the powdery materials are metals selected from the group consisting of niobium, tantalum, molybdenum, tungsten, rhenium, gold, silver, platinum, palladium, iron, cobalt, nickel and titanium.

11. Pastes according to any of claims 5–7, characterized in that the pastes are dielectric pastes, wherein the powdery materials are selected from the group consisting of refractory metal oxides, niobates, tantalates and titanates.

12. Pastes according to any of claims 5–7, characterized in that the pastes are silicide pastes.

13. Pastes according to claim 12 wherein the silicides are selected from the group consisting of molybdenum silicide and tungsten silicide.

14. Method for manufacturing the pastes according to any of claims 5–7, characterized in that the powdery materials are dispersed in water and are mixed with the associative thickeners.

15. Method of using the pastes made according to any of claims 5–7 for the coating of substrates by printing techniques.

16. Method according to claim 15 wherein the printing technique is screen printing.

17. Method according to claim 15 wherein the printing technique is lithography.

18. A coated substrate comprising a substrate coated with a paste made as in any of claims 5–7 and characterized in that the coating can be heated to 550° C. and then be essentially free of organic residual substances.

19. Coated substrate according to claim 18 wherein the powder particles are sintered to bond to each other and the substrate.

* * * * *